United States Patent [19]

Fedaravichjus et al.

[11] Patent Number: 4,791,720
[45] Date of Patent: Dec. 20, 1988

[54] APPARATUS FOR ORIENTING MAGNETIC CORES DURING FABRICATION OF MEMORY MATRICES

[75] Inventors: Algimantas J. Fedaravichjus; Antanas L. Sudintas, both of Kaunas; Vladimir S. Kondratiev, Moscow; Kazimeras M. Ragulskis, Kaunas, all of U.S.S.R.

[73] Assignee: Kaunasskii Politekhnicheskii Institut, Kaunas, U.S.S.R.

[21] Appl. No.: 85,365

[22] Filed: Aug. 14, 1987

[51] Int. Cl.[4] .............................................. H01F 41/08
[52] U.S. Cl. ........................................ 29/737; 29/743; 29/744
[58] Field of Search ................... 29/737, 743, 744, 604

[56] References Cited

FOREIGN PATENT DOCUMENTS 317107 10/1971 U.S.S.R. .
433538 6/1974 U.S.S.R. .

*Primary Examiner*—Carl E. Hall
*Attorney, Agent, or Firm*—Lilling & Greenspan

[57] ABSTRACT

The apparatus includes a housing accommodating, in succession of the process procedures, a mechanism for moving and separating magnetic cores and a magnetic head of a unit for orientating the magnetic cores above which there are disposed coordinate lines having the magnetic cores threaded thereon. The mechanism for moving and separating the magnetic cores includes distribution and guide combs spaced from each other and having teeth thereof facing the side of the coordinate lines. Arranged after the guide comb before the magnetic head is a comb for separating the magnetic cores, teeth of this comb having a bevel facing the side of the guide comb. Disposed in close proximity to the coordinate lines is a unit for pneumatically conveying the magnetic cores. All the combs and magnetic head rest in planes perpendicular to the plane of arrangement of the coordinate lines and are turned relative to these lines at an angle other than 90°. The housing accommodates a programming mechanism with a control unit.

4 Claims, 2 Drawing Sheets

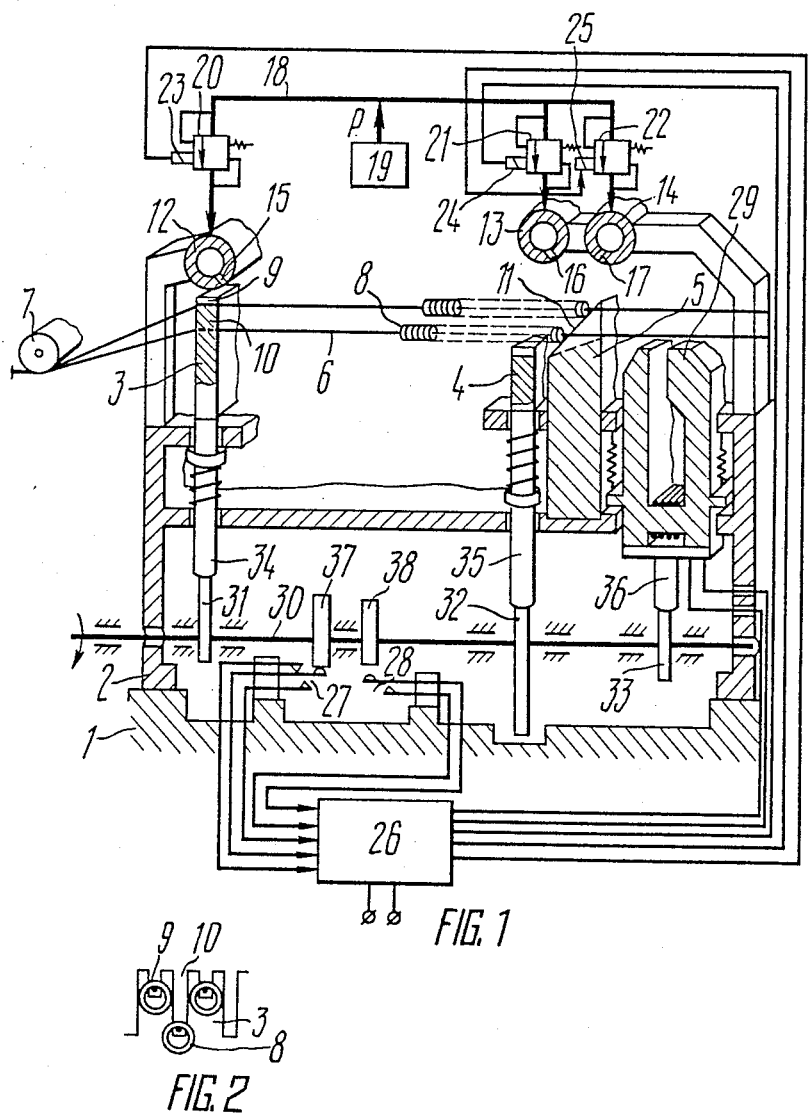

APPARATUS FOR ORIENTING MAGNETIC CORES DURING FABRICATION OF MEMORY MATRICES

BACKGROUND OF THE INVENTION

1. Field of the Invention

This invention relates to equipment for manufacturing RAM matrices on ring-shaped cores, and more particularly to apparatus for orientating magnetic cores during fabrication of memory matrices.

2. Description of the Prior Art

There is known an apparatus for assembling memory matrices (SU, A, No. 317,107) which includes a frame with strings of wire thereon on which magnetic cores are threaded, a movable carriage having secured thereon a weaving head, a rocker arm with two shaped plates, and an eccentric mechanism. The weaving head is capable of vertical displacement and has the form of a toothed plate with grooves in each tooth.

The magnetic heads are separated one at a time on each wire string by the shaped plate of the rocker arm, and moved to the weaving head thanks to the movement of the carriage and turning of the rocker arm counterclockwise. Simultaneously, the weaving head is raised, and the eccentric mechanism places the magnetic cores lengthwise of the toothed plate. The cores are held in place by forcing them by the wires to the base of the head and to the wall of the tooth.

However, separation, formation of rows and orientation of the magnetic cores mechanically frequently results in damage of the cores, thus making the apparatus less efficient in operation.

There is also known in apparatus for orienting magnetic cores used in the equipment for weaving a wire through magnetic cores of digital store matrices (SU, A, No. 433,538), which includes a housing accommodating, in succession of process procedures, a mechanism for moving and separating the magnetic cores, and a magnetic head of a unit for orienting the cores in the form of combs with magnetoconductive teeth. Overlying the teeth and stretched by means for taking up slack are coordinate wire lines having the magnetic cores threaded thereon in the zone of the mechanism for moving and separating the cores.

Separation of the magnetic cores one at a time on each wire line is carried out by means of a rotatable magnet. Under the force of the magnetic field the magnetic cores are caused to disperse to form a lateral row near a wire line stop. By the wire frame of the mechanism for moving and separating the cores this row of cores is displaced toward the magnetic head of the core orienting unit to be placed between the teeth of the combs. In this position the magnetic cores line up into a rectilinear lateral row to be oriented at a definite angle relative to each other. After this the cores are threaded by the lateral coordinate wire line.

However, the cores are susceptible to being damaged mechanically during separation. The cores are also susceptible to damage as they are positioned between the teeth of the combs of the magnetic head, since in the course of orientation they are subject to mechanical action, viz., pressure to the support rack.

Further, some operations involved are manually controlled, which makes the apparatus less efficient and reliable.

SUMMARY OF THE INVENTION

It is an object of the present invention to attain a higher quality of memory matrices.

Another object is to improve the reliability of an apparatus for orienting magnetic cores during fabrication of memory matrices.

One more object is to ensure a higher efficiency of operation of the proposed apparatus.

The objects of the invention are attained by an apparatus for orienting magnetic cores during fabrication of memory matrices comprising a housing accommodating, in succession of the process procedures, a mechanism for moving and separating the magnetic cores and a magnetic head of a unit for orienting the magnetic cores over which there are disposed coordinate lines having the magnetic cores threaded thereon in the zone of the mechanism for moving and separating the magnetic cores. According to the invention, the mechanism for moving and separating the magnetic cores includes distribution and guide combs spaced from each other in the direction of movement of the magnetic cores with teeth thereof facing the side of the coordinate lines. A comb for separating the magnetic core is disposed after the guide comb before the magnetic head with teeth of this comb having a bevel facing the guide comb, and a unit for pneumatically conveying the magnetic cores is disposed in close proximity to the coordinate lines, all the above combs and magnetic head resting in planes perpendicular to the plane of arrangement of the coordinate lines and turned relative to the coordinate lines to an angle other than 90°. The apparatus is further provided with a programming mechanism and a control unit accommodated inside the housing and ensuring, in accordance with the sequence of process procedures, the movement of the distribution and guide combs and magnetic head in a direction perpendicular to the plane of arrangement of the coordinate lines, and connection of the magnetic cores and the unit for pneumatically conveying the magnetic cores to the control unit.

In order to ensure the arrangement of the coordinate lines with the magnetic cores threaded thereon at as close as possible a distance from each other, it is necessary that every other recess between the teeth of the distribution comb and every other recess between the teeth of comb for separating the magnetic cores be of equal depth, whereas the depth of adjacent recesses be different.

For providing the movement of the distribution and guide combs and magnetic head, as well as for feeding compressed air and connecting the magnetic head to the control unit in accordance with the process procedure, it is preferable that the programming mechanism comprise a shaft accommodated inside the housing, programming cams secured on the shaft and kinematically linked with the distribution and guide combs and with the magnetic head connected to the control unit, and commutation cams secured on the shaft and electrically connected through switches to the control unit.

In order to ensure synchronous movement of the magnetic cores along the coordinate lines, it is advisable that the unit for pneumatically conveying the magnetic cores comprise nozzles communicating by way of air conduits with a source of compressed air, and solenoid-operated valves equal in number to the number of nozzles, disposed in the air conduits and electrically connected with the switches and with the control unit of the programing mechanism.

The proposed invention makes the apparatus more reliable and efficient in operation, as well as ensures a higher quality of memory matrices and provides for complete automation of the process of formation of the rows of magnetic cores.

BRIEF DESCRIPTION OF THE DRAWINGS

The invention will now be described in greater detail with reference to a specific embodiment thereof taken in conjunction with the accompanying drawings, in which:

FIG. 1 is a general schematic view of an apparatus for orienting magnetic cores during fabrication of memory matrices according to the invention;

FIG. 2 is a sectional view of a distribution comb of the mechanism for moving and separating magnetic cores of the apparatus according to the invention.

DESCRIPTION OF THE PREFERRED EMBODIMENT

Figure 3A:
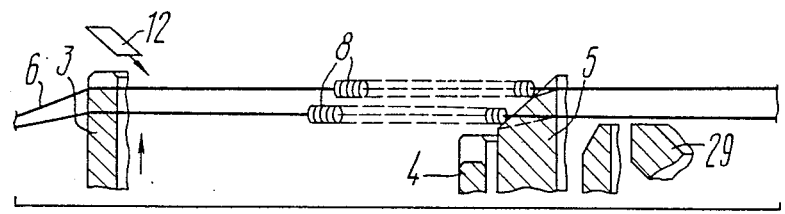
FIG. 3 shows stages of forming magnetic cores and their orientation in the apparatus according to the invention.
Figure 3B:
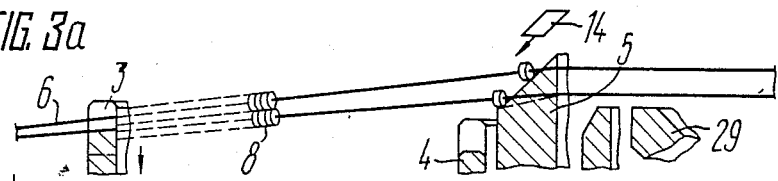
Figure 3C:
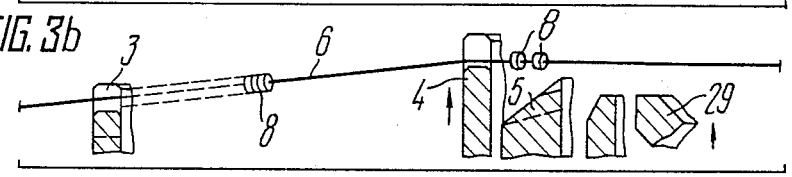
Figure 3D:
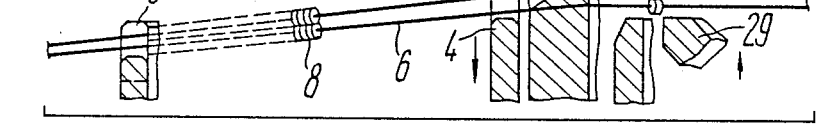

An apparatus for orienting magnetic cores during fabrication of memory matrices comprises a base 1 (FIG. 1) on which there is mounted a housing 2, a mechanism for moving and separating the magnetic cores, and a unit for orienting the magnetic cores, all arranged inside the housing in the sequence of process procedures. The mechanism for moving and separating the magnetic cores comprises distribution and guide combs 3 and 4, respectively, secured on the housing 2 and spaced a certain distance from each other, a comb 5 for separating the magnetic cores disposed after the guide comb 4, and a unit for pneumatically conveying the magnetic cores. The combs 3, 4 and 5 are arranged so that their teeth face coordinate lines 6 stretched above the mechanism for moving and separating the magnetic cores, such as by a means 7. Alternatively, the coordinate lines 6 can be stretched in any other suitable manner, for example, secured on a frame above the aforementioned mechanism. Threaded on the coordinate lines 6 are magnetic cores 8 arranged in groups between the combs 3 and 4.

Adjacent recesses 9 and 10 (FIG. 2) of the distribution comb 3 differ in depth, whereas all the recesses 9 are of the same depth and all the recesses 10 are likewise of equal depth. With reference again to FIG. 1, recesses of the comb 5 are fashioned in a similar manner, the teeth thereof having a bevel 11 facing the guide comb 4. Recesses between the teeth of the guide comb 4 are of equal depth.

The pneumatic conveyer of the magnetic cores is provided with nozzles 12, 13 and 14 having outlet slots 15, 16 and 17, respectively, directed toward the magnetic cores 8. The nozzles 12, 13 and 14 communicate by way of air conduits 18 with a source 19 of compressed air. The air conduits 18 have solenoid-operated valves 20, 21, 22 control windings 23, 24, 25 of which are wired to outputs of a programming mechanism control unit 26 whose inputs are connected to switches 27 and 28 mounted on the base 1. The nozzle 12 overlies the distribution comb 3, whereas the nozzles 13 and 14 overlie the comb 5 for separating the magnetic cores.

Mounted after the comb 5 is a magnetic head 29 of the unit for orienting the magnetic cores connected with the control unit 26. The magnetic head 29, and combs 3, 4, and 5 are disposed in planes substantially perpendicular to the plane of the coordinate lines 6 and turned relative to the lines 6 an angle other than 90°. In addition, the magnetic head 29 and combs 3 and 4 are capable of moving in a direction perpendicular to the plane of the lines 6.

The housing 2 also accommodates a programming mechanism which comprises a shaft 30 underlying the combs 3, 4, 5 and a magnetic head 29 and connected to an electric motor drive (not shown). The shaft 30 carries programming cams 31, 32, 33 engageable with stems 34, 35, 36 of the combs 3, 4 and magnetic head 29, respectively, and commutation cams 37 and 38 electrically connected with the switches 27 and 28.

FIG. 3 illustrates positions assumed by the distribution and guide combs 3 and 4 and magnetic head at various stages of forming the row of magnetic cores and their orientation.

The proposed apparatus operates in the following manner.

The combs 3 and 5 (FIG. 1) are positioned so that their grooves of equal depth face each other. Then all the coordinate lines 6 with the magnetic cores 8 threaded thereon are placed in the recesses 9 and 10 (FIG. 2) of the combs 3 and 5 (FIG. 1) providing that the coordinate lines 6 be spaced at a predetermined distance from each other. By rotating the shaft 30 the programming cams 31, 32, 33 are set in the initial position. Therewith, the distribution comb 3 (FIG. 3a) assumes the topmost position, lines 6 lie horizontally, whereas the guide comb 4 and magnetic head 29 take the bottommost position. Rotation of the shaft 30 causes the commutation cam 37 to close the upper contact of the switch 27 thereby ensuring energization of the solenoid-operated valves 20 and 21. This is accompanied by admission of compressed air to the nozzles 12 and 13 for the air to escape from the slots 15 and 16 and convey the magnetic cores 8 (FIG. 3a) toward the comb 5. The shaft 30 (FIG. 1) with the programming cams 31, 32, 33 is rotated further so that the comb 3 (FIG. 3b) assumes the bottommost position. The lines 6 are caused to depart from the horizontal for each line 6 to force one core 8 to the bevel 11 of the comb 5. After this the shaft 30 (FIG. 1) is rotated to open the upper contact of the switch 27, the solenoid-operated valves 20 and 21 act to shut off the air conduits 18, and the delivery of compressed air to the nozzles 12 and 13 is terminated.

During a still further rotation of the shaft 30 the commutation cam 37 closes the lower contact of the switch 27, whereby a voltage is applied to the solenoid-operated valve 22. Compressed air enters the nozzle 14. A jet of compressed air displaces the free magnetic cores 8 toward the comb 3. Therefore, only one magnetic core 8 remains on each line 6 above the comb 5.

Rotation of the shaft 30 causes the cam 32 to engage with the guide comb 4 (FIG. 3c) and elevate it to the topmost position, the lines 6 resting above the comb 5. Because the recesses of the guide comb are of equal depth, the lines 6 line in one plane. The commutation cam 38 (FIG. 1) acts to close the contacts of the switch 28 and the coil of the magnetic head 29 is energized. A magnetic field is generated between the poles of the magnetic head 29 which acts to move the magnetic cores 8 (one on each line 6) above the comb 5 toward the magnetic head 29 for the cores 8 to be placed above the gap between the poles thereof. In this manner a row of magnetic cores 8 (FIG. 3d) is formed above the magnetic head 29.

Figure 3E:
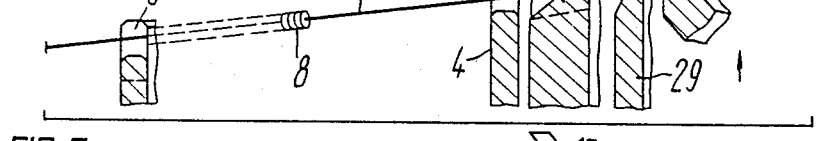
Figure 3F:
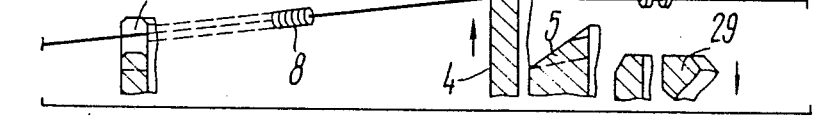

During a further rotation of the shaft 30 (FIG. 1) the programming cam 32 engages with the comb 4 for the latter to be lowered, whereas the coordinate lines 6 enter the recesses of the comb 5. The magnetic head 29 is raised by the programming cam 33, and the row of magnetic cores 8 enter the interpole gap of the magnetic head 29 (FIG. 3e). Since the magnetic head 29 (FIG. 1) is turned relative to the coordinate lines 6 an angle close to 60°, the cores 8 are oriented so that the holes of all of the cores 8 are in front of each other. In this position the magnetic cores 8 are woven.

After weaving a wire through the cores 8 the shaft 30 is turned for the magnetic head 29 to be lowered (FIG. 3f) and the commutation cam 38 (FIG. 1) to open the contact of the switch 28. At the same time, the commutation cam 37 closes the upper contact of the switch 27 thereby ensuring energization of the solenoid-operated valves 20 and 21. Compressed air is admitted to the nozzles 12 and 13, and escapes from the slots 15 and 16 to force the threaded magnetic cores 8 toward the combs 4, whereas the row of woven magnetic cores 8 is forced out of the working zone. Thereafter, the cycle of operation of the proposed apparatus is repeated.

In view of the aforedescribed, using as a mechanism for moving and separating magnetic cores the movable combs 3 and 4 enabling to change the position of the coordinate lines 6 with the magnetic cores 8 threaded thereon and separate the cores 8 through forcing them by the coordinate lines 6 to the bevel 11 of the comb 5 makes it possible to avoid damage of the cores 8 during separation. This ensures a more reliable formation of rows of the magnetic cores 8.

By virtue of the fact that displacement of the cores 8 along the coordinate lines 6 is effected pneumatically through the use of controllable feed of compressed air by the solenoid-operated valves 20, 21 and 22 energized in agreement with the movement of the combs 3, 4 and magnetic head 29, the procedures are carried out efficiently and continuously. This in turn promotes the formation of rows of magnetic cores 8 and makes it possible to avoid mechanical damage thereof.

The use in the unit for pneumatically conveying the cores of the nozzles 12, 13, 14 disposed under the stretched coordinate lines 6 is parallel therewith, as well as with the combs 3, 4, 5 and with the interpole gap of the magnetic head 29, allows cophasal movement of the cores 8 along all the coordinate lines 6. This also ensures a more reliable operation of the apparatus and higher rate of formation of rows of the cores 8.

Thanks to the fact that the adjacent recesses between the teeth of the combs 3 and 5 are of different depth, it is possible to allow a shorter distance between the coordinate lines 6, and as a consequence to form a shorter row of cores 8, thereby resulting in less time to be consumed for weaving a wire therethrough.

Application of the proposed apparatus for orientating magnetic cores 8 in an integrated set of machines for assembling memory matrices has shown that the increase in the speed of some operations and faster response of the apparatus in general allowed to reduce by 45–50% the time consumed for forming a lateral row of 270 magnetic cores 0.3 mm in the outside diameter. Because the magnetic cores 8 are separated virtually without a mechanical action applied thereto, it is possible to dispense with inadvertent stops of the apparatus for replacing the cores 8. Therefore, the thus improved reliability ensures a higher speed of forming the rows of cores 8.

The invention can be used in the assembly of memory matrices to carry out operations associated with separating magnetic cores, forming lateral rows thereof, and orientating the cores with the aim of weaving laterally a wire through the cores during patternless manufacture of memory matrices.

What is claimed is:

1. An apparatus for orienting magnetic cores during fabrication of memory matrices comprising:
   a housing;
   a mechanism for moving and separating said magnetic cores accommodated inside said housing;
   a unit for orienting the magnetic cores accommodated inside said housing for moving and separating the magnetic cores;
   coordinate lines having the magnetic cores threaded thereon and arranged in a plane above said mechanism for moving and separating the magnetic cores and above the unit for orienting the magnetic cores;
   a distribution comb of said mechanism for moving and separating the magnetic cores ensuring variation in the position of said coordinate lines, arranged in a plane perpendicular to said plane of arrangement of said coordinate lines and turned relative to said coordinate lines to an angle other than 90°; said distribution comb having teeth and recesses, and said teeth facing the side of said coordinate lines;
   a guide comb of said mechanism for moving and separating the magnetic cores ensuring variation in the position of said coordinate lines and spaced at a distance from said distribution comb in a plane perpendicular to said plane of arrangement of said coordinate lines and turned relative to said coordinate lines to an angle other than 90°, said guide comb having teeth and recesses of said guide comb, and said teeth facing the side of said coordinate lines;
   a comb for separating the magnetic cores of said mechanism for moving and separating the magnetic cores disposed after said guide comb in a plane perpendicular to said plane of arrangement of said coordinate lines and turned relative to said coordinate lines to an angle other than 90°, said comb for separating having teeth and recesses of said comb for separating the magnetic cores, and said teeth facing the side of said coordinate lines and having bevels facing the side of said guide comb;
   a magnetic head of said unit for orienting the magnetic cores disposed after said comb for separating the magnetic cores in a plane perpendicular to said plane of arrangement of said coordinate lines and turned relative to said coordinate lines to an angle other than 90°;
   a unit for pneumatically conveying the magnetic cores of said mechanism for moving and separating the magnetic cores disposed in close proximity to said coordinate lines;
   a control unit connected to said magnetic head and unit for pneumatically conveying the magnetic cores; and
   a programming mechanism disposed inside said housing and ensuring the movement of said distribution and guide combs and said magnetic head in a direction perpendicular to said plane of arrangement of said coordinate lines; said magnetic head and unit for pneumatically conveying the magnetic cores being connected to said control unit.

2. An apparatus as defined in claim 1, in which every other of said recesses between said teeth of said distribution comb and said comb for separating said magnetic cores have equal depth, whereas the depth of the adjacent recesses is different.

3. An apparatus as defined in claim 1, in which said programming mechanism comprises:
 a shaft accommodated inside said housing;
 programming cams secured on said shaft and kinematically linked with said distribution comb, guide comb and magnetic head;
 switches connected to said control unit; and
 commutation cams secured on said shaft and electrically connected through said switches to said control unit.

4. An apparatus as defined in claim 1, in which said unit for pneumatically conveying the magnetic cores comprises:
 nozzles arranged in close proximity to said distribution comb, guide comb and comb for separating the magnetic cores;
 air conduits;
 a source of compressed air;
 said nozzles communicating with said source of compressed air by way of said air conduits; and
 solenoid-operated valves provided in said air conduits and electrically connected with said switches and said control unit.

* * * * *